US012616047B2

(12) United States Patent
Lee et al.

(10) Patent No.: US 12,616,047 B2
(45) Date of Patent: Apr. 28, 2026

(54) METHOD OF FABRICATING A SEMICONDUCTOR PACKAGE INCLUDING AN INTERPOSER

(71) Applicant: SAMSUNG ELECTRONICS CO., LTD., Suwon-si (KR)

(72) Inventors: Ju Hyung Lee, Siheung-si (KR); Dong Uk Kwon, Asan-si (KR); Sun Chul Kim, Hwaseong-si (KR); Yong Hyun Kim, Asan-si (KR); Min Jae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 702 days.

(21) Appl. No.: 17/804,742

(22) Filed: May 31, 2022

(65) Prior Publication Data

US 2023/0081723 A1     Mar. 16, 2023

(30) Foreign Application Priority Data

Sep. 14, 2021     (KR) ......................... 10-2021-0122279

(51) Int. Cl.
| | |
|---|---|
| *H01L 23/00* | (2006.01) |
| *H01L 23/31* | (2006.01) |
| *H01L 23/538* | (2006.01) |

(52) U.S. Cl.
CPC .......... *H01L 24/75* (2013.01); *H01L 23/3128* (2013.01); *H01L 23/5383* (2013.01); *H01L 23/5389* (2013.01); *H01L 24/81* (2013.01); *H01L 2224/75305* (2013.01); *H01L 2224/81203* (2013.01); *H01L 2924/3512* (2013.01)

(58) Field of Classification Search
CPC . H01L 24/75; H01L 23/5383; H01L 23/5389; H01L 24/08; H01L 2224/75305; H01L 23/49833
USPC ......................................................... 257/688
See application file for complete search history.

(56) References Cited

U.S. PATENT DOCUMENTS

| | | | |
|---|---|---|---|
| 7,179,887 | B2 | 2/2007 | Ogata |
| 7,736,950 | B2 | 6/2010 | Pendse et al. |
| 8,381,965 | B2 | 2/2013 | Jang et al. |
| 9,991,248 | B2 | 6/2018 | Fan |
| 10,121,774 | B2 | 11/2018 | Ko |

(Continued)

FOREIGN PATENT DOCUMENTS

| | | | | |
|---|---|---|---|---|
| JP | H0897247 | A | * | 4/1996 |
| JP | 2003109988 | | | 4/2003 |

(Continued)

*Primary Examiner* — Norman D Richards
*Assistant Examiner* — Laura M Dykes
(74) *Attorney, Agent, or Firm* — MORGAN, LEWIS & BOCKIUS LLP

(57) ABSTRACT

A method of fabricating a semiconductor package includes disposing a preliminary semiconductor package on a stage, the preliminary semiconductor package including a substrate to which a pad part is attached, an interposer disposed on the substrate, and a semiconductor chip disposed between the substrate and the interposer. A bonding tool is disposed on the interposer. The bonding tool includes a first region and a second region outside of the first region. The second region of the bonding tool corresponds to the pad part. The interposer and the substrate are bonded to each other.

17 Claims, 18 Drawing Sheets

(56)  References Cited

U.S. PATENT DOCUMENTS

| | | | |
|---|---|---|---|
| 2001/0013652 A1* | 8/2001 | Hino ....................... | H01L 24/11 |
| | | | 257/737 |
| 2013/0292455 A1* | 11/2013 | Brofman ................ | B23K 3/047 |
| | | | 228/256 |
| 2019/0229084 A1* | 7/2019 | Song ....................... | H01L 24/75 |
| 2019/0273074 A1 | 9/2019 | Cho et al. | |
| 2020/0395346 A1 | 12/2020 | Jung et al. | |

FOREIGN PATENT DOCUMENTS

| | | |
|---|---|---|
| JP | 2010177604 | 8/2010 |
| JP | 2019140192 | 8/2019 |
| KR | 10-2019-0105343 A | 9/2019 |
| KR | 10-2020-0142191 A | 12/2020 |

* cited by examiner

FIG. 18

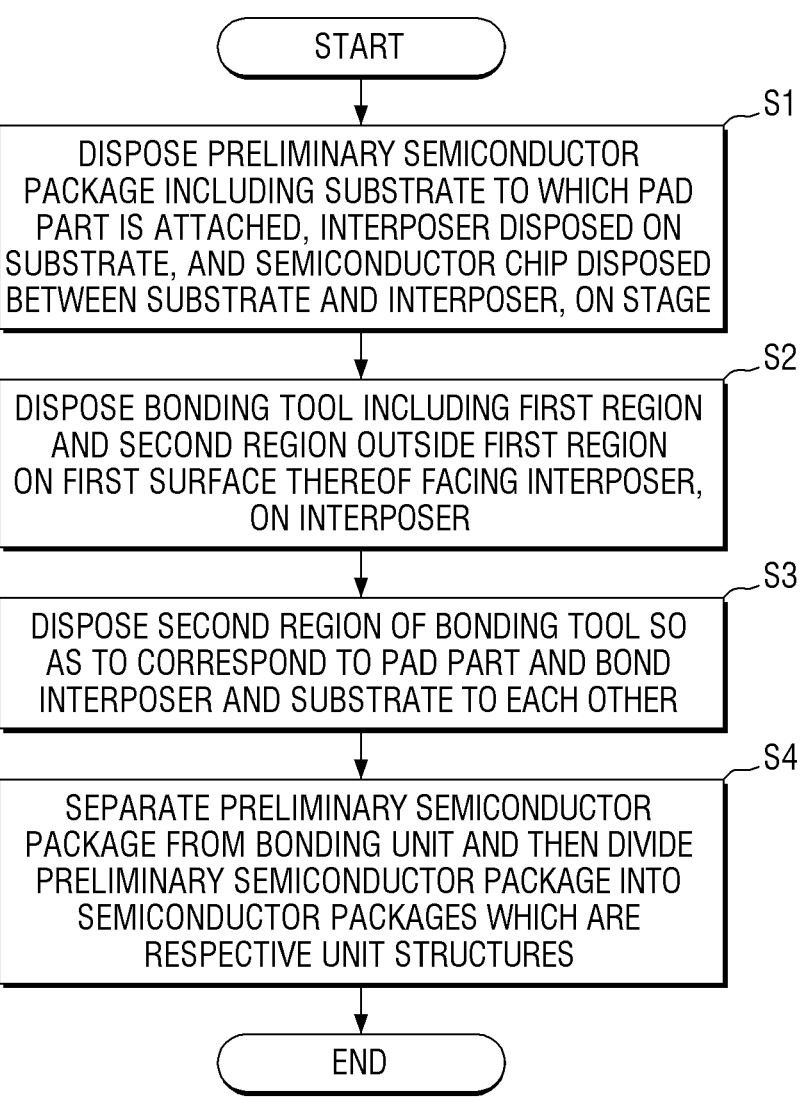

START

DISPOSE PRELIMINARY SEMICONDUCTOR PACKAGE INCLUDING SUBSTRATE TO WHICH PAD PART IS ATTACHED, INTERPOSER DISPOSED ON SUBSTRATE, AND SEMICONDUCTOR CHIP DISPOSED BETWEEN SUBSTRATE AND INTERPOSER, ON STAGE ⌐ S1

DISPOSE BONDING TOOL INCLUDING FIRST REGION AND SECOND REGION OUTSIDE FIRST REGION ON FIRST SURFACE THEREOF FACING INTERPOSER, ON INTERPOSER ⌐ S2

DISPOSE SECOND REGION OF BONDING TOOL SO AS TO CORRESPOND TO PAD PART AND BOND INTERPOSER AND SUBSTRATE TO EACH OTHER ⌐ S3

SEPARATE PRELIMINARY SEMICONDUCTOR PACKAGE FROM BONDING UNIT AND THEN DIVIDE PRELIMINARY SEMICONDUCTOR PACKAGE INTO SEMICONDUCTOR PACKAGES WHICH ARE RESPECTIVE UNIT STRUCTURES ⌐ S4

END

METHOD OF FABRICATING A SEMICONDUCTOR PACKAGE INCLUDING AN INTERPOSER

CROSS-REFERENCE TO RELATED APPLICATION

This application claims priority under 35 U.S.C. § 119 to Korean Patent Application No. 10-2021-0122279, filed in the Korean Intellectual Property Office on Sep. 14, 2021, the contents of which are herein incorporated by reference in its entirety.

TECHNICAL FIELD

The present disclosure relates to semiconductors and, more specifically, to a semiconductor package and a method of fabricating the same.

DISCUSSION OF THE RELATED ART

Electronic components are increasingly being miniaturized. In accordance with such a trend, a method of stacking and mounting several semiconductor chips on one package wiring structure or stacking a package on a package may be used. In this case, an interposer may be used to establish an electrical connection between an upper package and a lower package. Moreover, the interposer may prevent warpage of the upper package and the lower package.

In order to connect the interposer to the lower package, solder may be bonded between the interposer and the lower package by thermal compression (TC) bonding in a thermal compression manner using a bonding tool.

Conventionally, in fabricating such a semiconductor package, copper core balls may be used to connect and support the interposer and the lower package. In this case, separate processes are used to attach the copper core balls and the solders to the interposer, and thus, the number of process steps increases. In addition, thermal compression may cause cracks to occur in the copper balls.

SUMMARY

A method of fabricating a semiconductor package includes disposing a preliminary semiconductor package on a stage. The preliminary semiconductor package includes a substrate to which a pad part is attached. An interposer is disposed on the substrate. A semiconductor chip is disposed between the substrate and the interposer. A bonding tool is disposed on the interposer. The bonding tool includes a first region and a second region outside of the first region on a first surface thereof facing the interposer. The second region of the bonding tool is disposed so as to correspond to the pad part. The interposer and the substrate are bonded to each other.

A method of fabricating a semiconductor package includes disposing a preliminary semiconductor package on a stage. The preliminary semiconductor package includes a substrate having a recess formed therein. An interposer is disposed on the substrate. A semiconductor chip is disposed between the substrate and the interposer. A bonding tool is disposed on the interposer. The bonding tool includes a first region and a second region outside of the first region on a first surface thereof facing the interposer. The second region of the bonding tool is disposed so as to correspond to the recess. The interposer and the substrate are bonded to each other.

A semiconductor substrate bonding device includes a stage on which a preliminary semiconductor package is loaded. The preliminary semiconductor package includes a substrate to which a pad part is attached. An interposer is disposed on the substrate. A semiconductor chip is disposed between the substrate and the interposer. A bonding tool is disposed on the stage. The bonding tool includes a first region and a second region outside of the first region on a first surface thereof facing the interposer. A protrusion part protrudes from the second region on the first surface. The protrusion part is spaced apart from an outer peripheral surface of the bonding tool.

A semiconductor substrate bonding device includes a stage on which a preliminary semiconductor package is loaded. The preliminary semiconductor package includes a substrate to which a pad part is attached. An interposer is disposed on the substrate. A semiconductor chip is disposed between the substrate and the interposer. A bonding tool is disposed on the stage. The bonding tool extends in first and second directions crossing each other. A first region and a second region outside of the first region are disposed on a first surface of the bonding tool facing the interposer. The bonding tool includes a pair of first protrusion parts formed in the second region and facing each other in the first direction and a pair of second protrusion parts formed in the second region and facing each other in the second direction. A height of the pair of first protrusion parts and a height of the pair of second protrusion parts are different from each other.

A semiconductor package includes a substrate having a recess exposing at least one side surface thereof and formed at an edge thereof and including a pad part disposed in the recess and a first wiring layer spaced apart from the pad part. An interposer is disposed on the substrate and includes a second wiring layer. A semiconductor chip is disposed between the substrate and the interposer. A connection member electrically connects the substrate and the interposer to each other.

BRIEF DESCRIPTION OF THE DRAWINGS

The above and other aspects and features of the present disclosure will become more apparent by describing in detail embodiments thereof with reference to the attached drawings, in which:

FIG. 18 is a flowchart illustrating a method of fabricating a semiconductor package using the semiconductor substrate bonding device according to embodiments of the present disclosure.

DETAILED DESCRIPTION OF THE EMBODIMENTS

Hereinafter, a semiconductor package according to embodiments will be described with reference to FIGS. 1 to 5.

Figure 1:
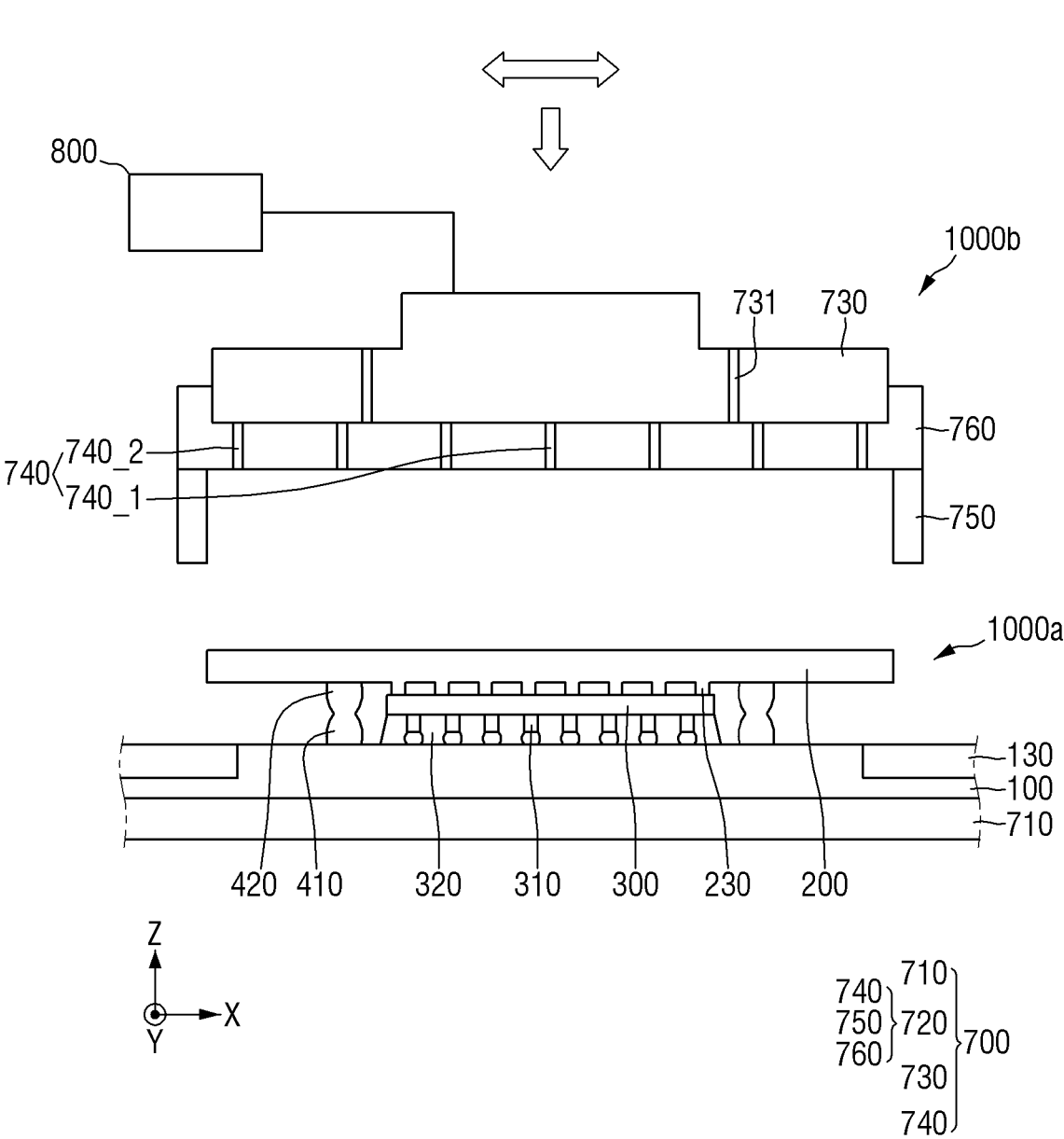
FIG. 1 is a cross-sectional schematic view illustrating a semiconductor substrate bonding device used for fabricating a semiconductor package according to embodiments of the present disclosure.
Figure 2:
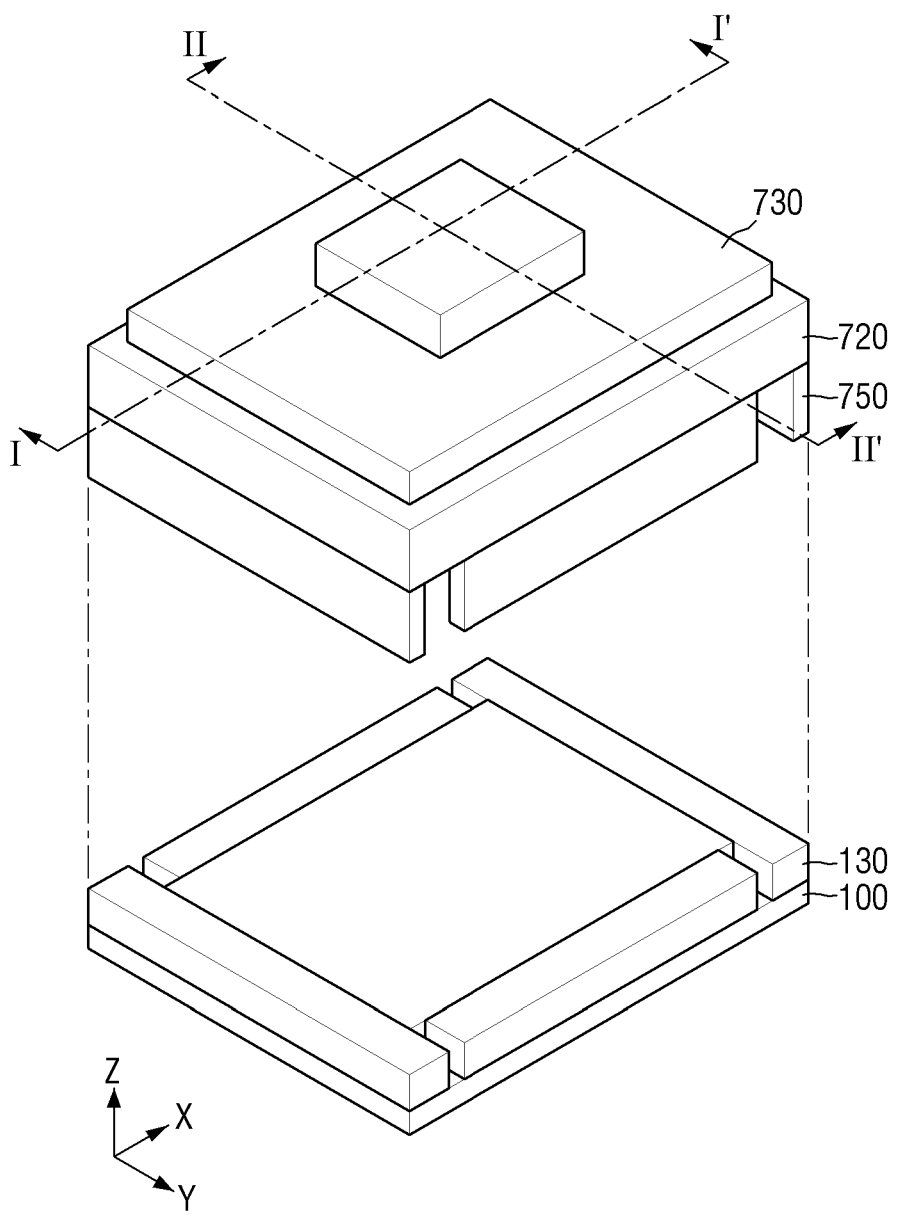
FIG. 2 is a perspective view illustrating a positional relationship between a bonding unit constituting the semiconductor substrate bonding device and a substrate constituting the semiconductor package according to embodiments of the present disclosure.
Figure 3:
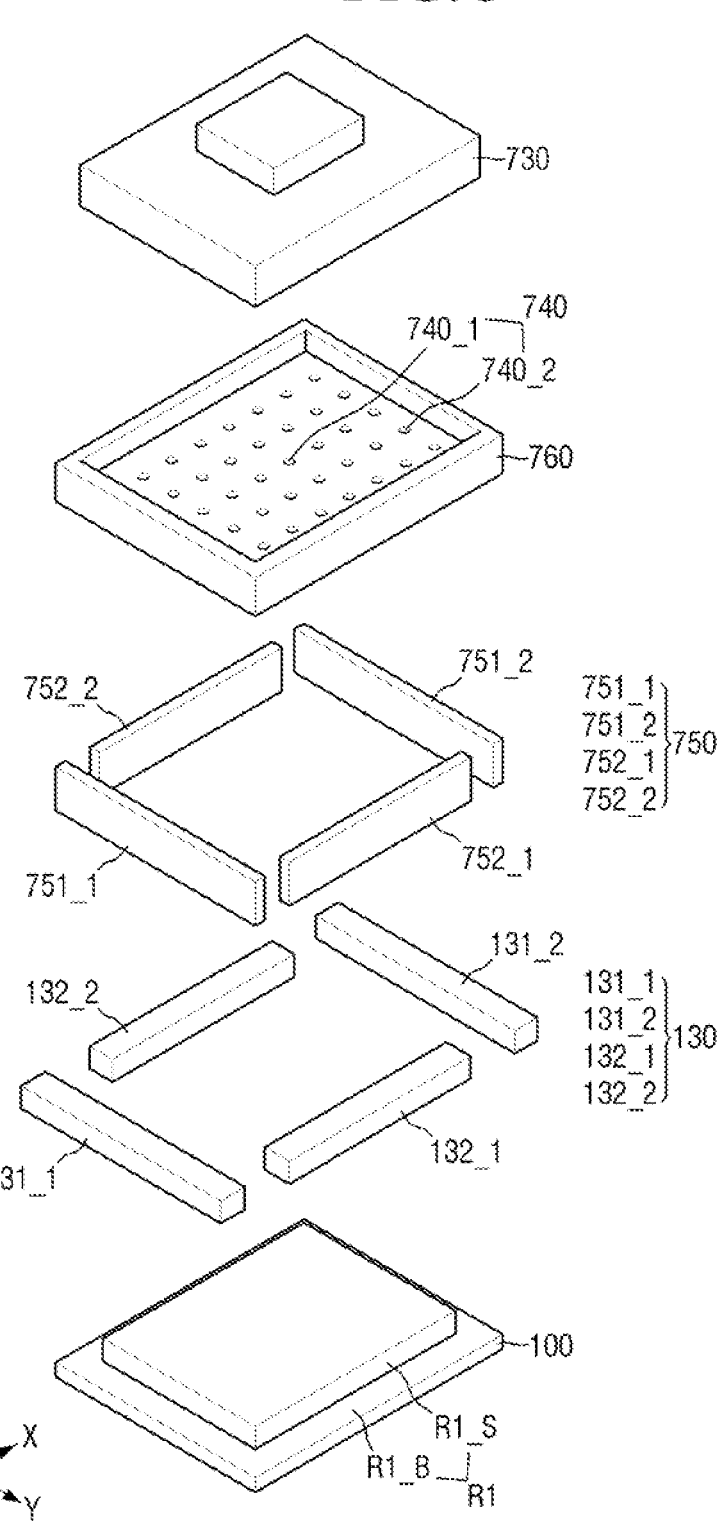
FIG. 3 is a perspective view illustrating a coupling relationship between the bonding unit constituting the semiconductor substrate bonding device and the substrate constituting the semiconductor package according to embodiments of the present disclosure.
Figure 4:
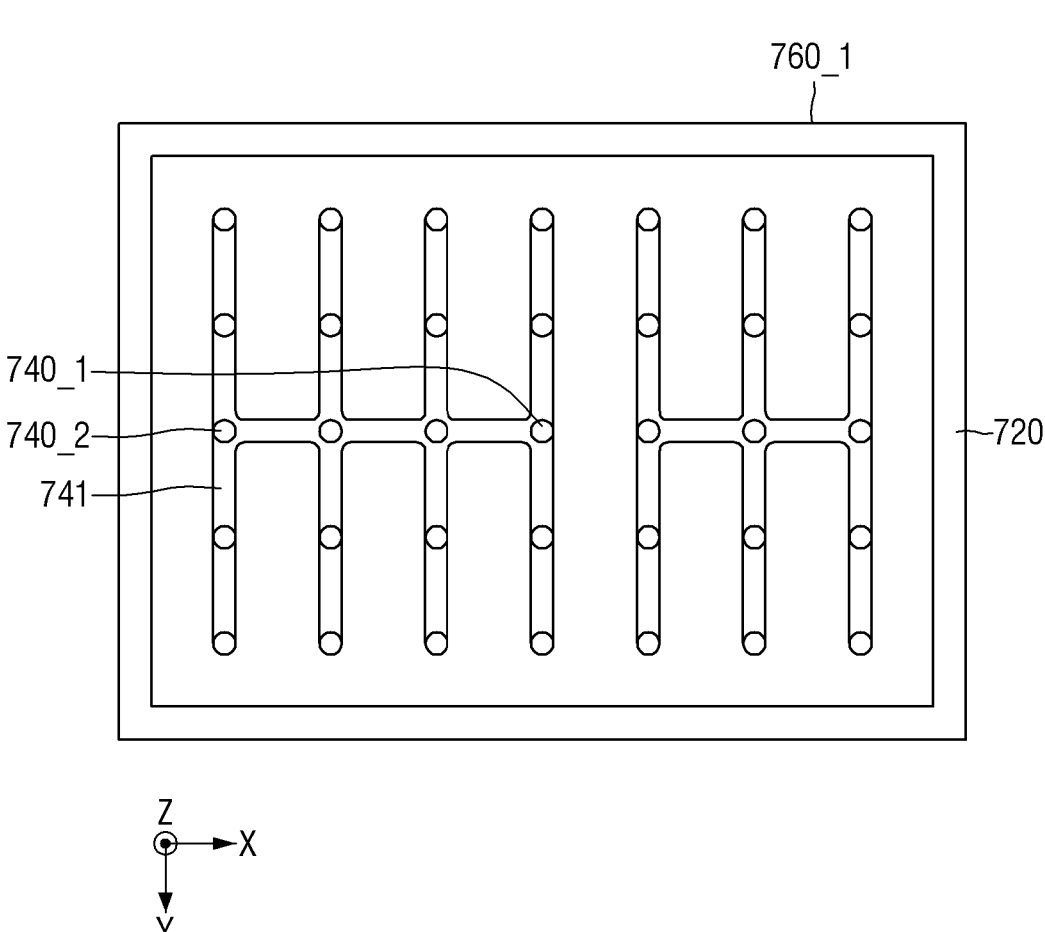
FIG. 4 is a plan view illustrating an upper surface of a bonding tool constituting the semiconductor substrate bonding device according to embodiments of the present disclosure, when viewed from above.
Figure 5:
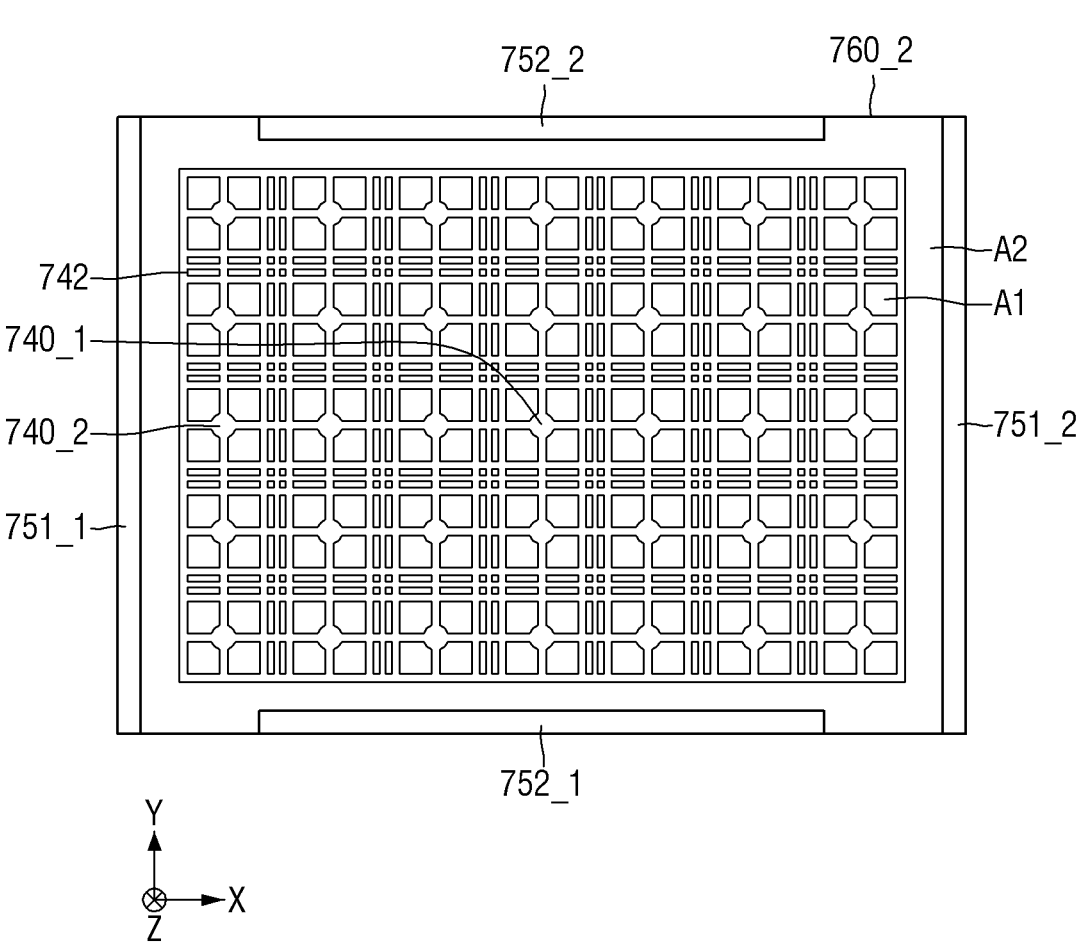
FIG. 5 is a plan view illustrating a lower surface of the bonding tool constituting the semiconductor substrate bonding device according to embodiments of the present disclosure, when viewed from the bottom.

FIG. 1 is a cross-sectional schematic view illustrating a semiconductor substrate bonding device used for fabricating a semiconductor package according to embodiments of the present disclosure. FIG. 2 is a perspective view illustrating a positional relationship between a bonding unit constituting the semiconductor substrate bonding device and a substrate constituting the semiconductor package according to embodiments of the present disclosure. FIG. 3 is a perspective view illustrating a coupling relationship between the bonding unit constituting the semiconductor substrate bonding device and the substrate constituting the semiconductor package according to embodiments of the present disclosure. FIG. 4 is a plan view illustrating an upper surface of a bonding tool constituting the semiconductor substrate bonding device according to embodiments of the present disclosure when viewed from above. FIG. 5 is a plan view illustrating a lower surface of the bonding tool constituting the semiconductor substrate bonding device according to embodiments of the present disclosure, when viewed from the bottom.

Referring to FIG. 1, a semiconductor substrate bonding device includes a bonding unit 700 and a vacuum unit 800. The bonding unit 700 may include a stage 710, a bonding tool 720, and a bonding head 730.

The semiconductor substrate bonding device may be used when bonding solders between an interposer 200 and a substrate 100 by thermal compression (TC) bonding in order to connect the interposer 200 and the substrate 100 to each other in a process of fabricating a semiconductor package.

The semiconductor substrate bonding device may be used when fabricating a system in package (SiP), for example, when fabricating a high bandwidth memory (HBM) having a stack structure to which through silicon vias (TSVs) are applied.

The bonding head 730 may provide heat and pressure for thermal compression bonding. The bonding head 730 may be installed at the uppermost level of the semiconductor substrate bonding device, and may provide heat and pressure in a downward direction (a third direction Z) in order to bond the interposer 200 and the substrate 100 positioned therebelow to each other.

The stage 710 may be installed at the lowest level of the semiconductor substrate bonding device, and may support the bonding head 730 and the bonding tool 720 installed thereabove. The stage 710 may be made of a material (e.g., ceramic) capable of conducting heat and having excellent heat resistance, and may be formed to have a wider width than the bonding head 730 and the bonding tool 720 in a first direction X or a second direction Y crossing the first direction X.

The bonding tool 720 may press a preliminary semiconductor package 1000a on the interposer 200 in order to bond the interposer 200 and the substrate 100 to each other. The bonding tool 720 may press the interposer 200 and the semiconductor chip 300 according to the heat and the pressure applied from the bonding head 730 thereon.

The bonding tool 720 includes a flat plate part 760 extending in each of the first direction X and the second direction Y. The flat plate part 760 includes a first surface 760_1 (see FIG. 4) facing the bonding head 730 and a second surface 760_2 (See FIG. 5) facing the first surface 760_1. The first surface 760_1 may be in contact with the bonding head 730, and the second surface 760_2 may be in contact with the interposer 200.

The second surface 760_2 includes a first region A1 pressing a region adjacent to the center of the interposer 200 and a second region A2 pressing an edge region of the interposer 200. To this end, the second region A2 may be disposed at a peripheral portion of the first region A1 so as to at least partially surround the first region A1.

The bonding tool 720 includes a plurality of holes 740 penetrating through the bonding tool 720. The plurality of holes 740 may be vacuum holes adsorbing the interposer 200. The plurality of holes 740 may include first holes 740_1 adsorbing the region adjacent to the center of the interposer 200 and second holes 740_2 adsorbing a region adjacent to the edge region of the interposer 200. The second holes 740_2 may be disposed in peripheral portions of the first holes 740_1 in the bonding tool 720 so as to at least partially surround the first holes 740_1. Therefore, the plurality of holes 740 may stably adsorb (e.g., grab) the interposer 200.

The plurality of holes 740 may be formed in the first surface 760_1 and the second surface 760_2 of the bonding tool 720 so as to correspond to each other in the third direction Z. The plurality of holes 740 may adsorb the interposer 200 through first vacuum lines 741 formed on the first surface 760_1 of the bonding tool 720 and second vacuum lines 742 formed on the second surface 760_2 of the bonding tool 720.

The plurality of holes 740 may adsorb the interposer 200 together with holes 731 formed in the bonding head 730. The plurality of holes 740 and the holes 731 of the bonding head 730 may be connected to the vacuum unit 800. The vacuum unit 800 may control a process of adsorbing the preliminary semiconductor package 1000a by the bonding unit 700.

Figure 10:
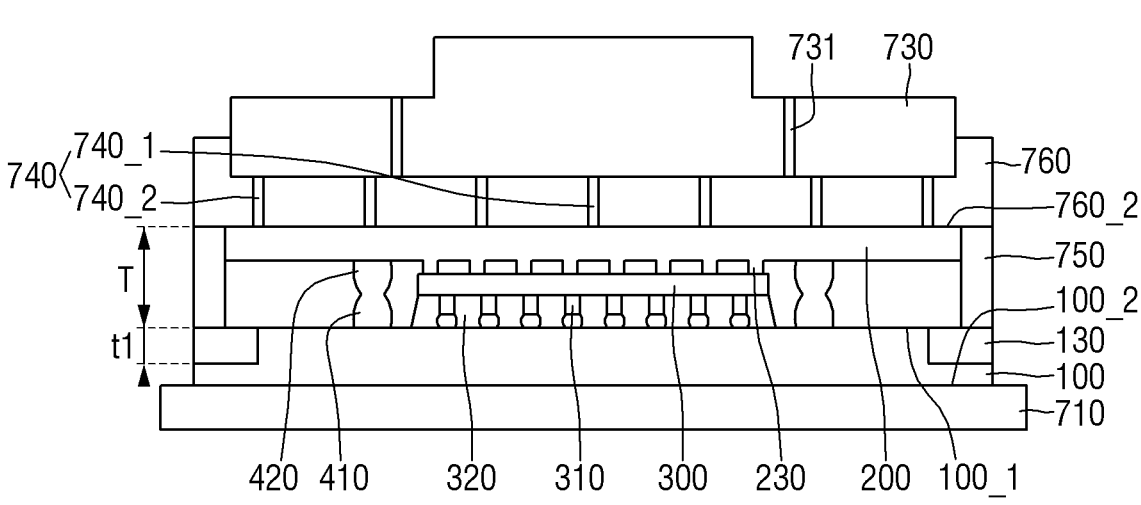
FIG. 10 is a cross-sectional schematic view illustrating structures of a semiconductor substrate bonding device and a preliminary semiconductor package according to embodiments of the present disclosure.

The bonding tool 720 includes a protrusion part 750 formed in the second region A2 and protruding from the second surface 760_2 of the flat plate part 760. Referring to FIG. 10, a thickness T of the protrusion part 750 may be the same as a distance between a first surface 100_1 of the substrate 100 and the second surface 760_2 of the flat plate part 760.

The protrusion part 750 may include a pair of first protrusion parts 751_1 and 751_2 facing each other in the first direction X and a pair of second protrusion parts 752_1 and 752_2 facing each other in the second direction Y. Each of the pair of first protrusion parts 751_1 and 751_2 may extend along the second direction Y, and each of the pair of second protrusion parts 752_1 and 752_2 may extend along the first direction X. A length of each of the pair of second protrusion parts 752_1 and 752_2 extending along the first direction X may be smaller than a length of the bonding tool 720 extending along the first direction X. However, the present disclosure is not necessarily limited thereto, and the length of each of the pair of second protrusion parts 752_1 and 752_2 extending along the first direction X may also be the same as the length of the bonding tool 720 extending along the first direction X.

The pair of first protrusion parts 751_1 and 751_2 may have the same thickness as each other, and the pair of second protrusion parts 752_1 and 752_2 may have the same thickness as each other. The thickness of the pair of first protrusion parts 751_1 and 751_2 and the thickness of the pair of second protrusion parts 752_1 and 752_2 may be different from each other.

The protrusion part 750 of the bonding tool 720 may be integrally formed with the flat plate part 760. The flat plate part 760 and the protrusion part 750 of the bonding tool 720 may be made of a material capable of conducting heat and having excellent heat resistance, similar to the bonding head 730. For example, the bonding tool 720 may include aluminum nitride (AlN) or silicon carbide (SiC). However, the present disclosure is not necessarily limited thereto.

Hereinafter, semiconductor substrate bonding devices according to embodiments of the present disclosure will be described with reference to FIGS. 6 to 9. For convenience of explanation, contents different from those of the semiconductor substrate bonding device illustrated in FIGS. 1 to 5 will be mainly described. To the extent that one or more elements are not discussed in detail below, it may be assumed that those elements are at least similar to corresponding elements discussed elsewhere within the instant specification.

Figure 6:
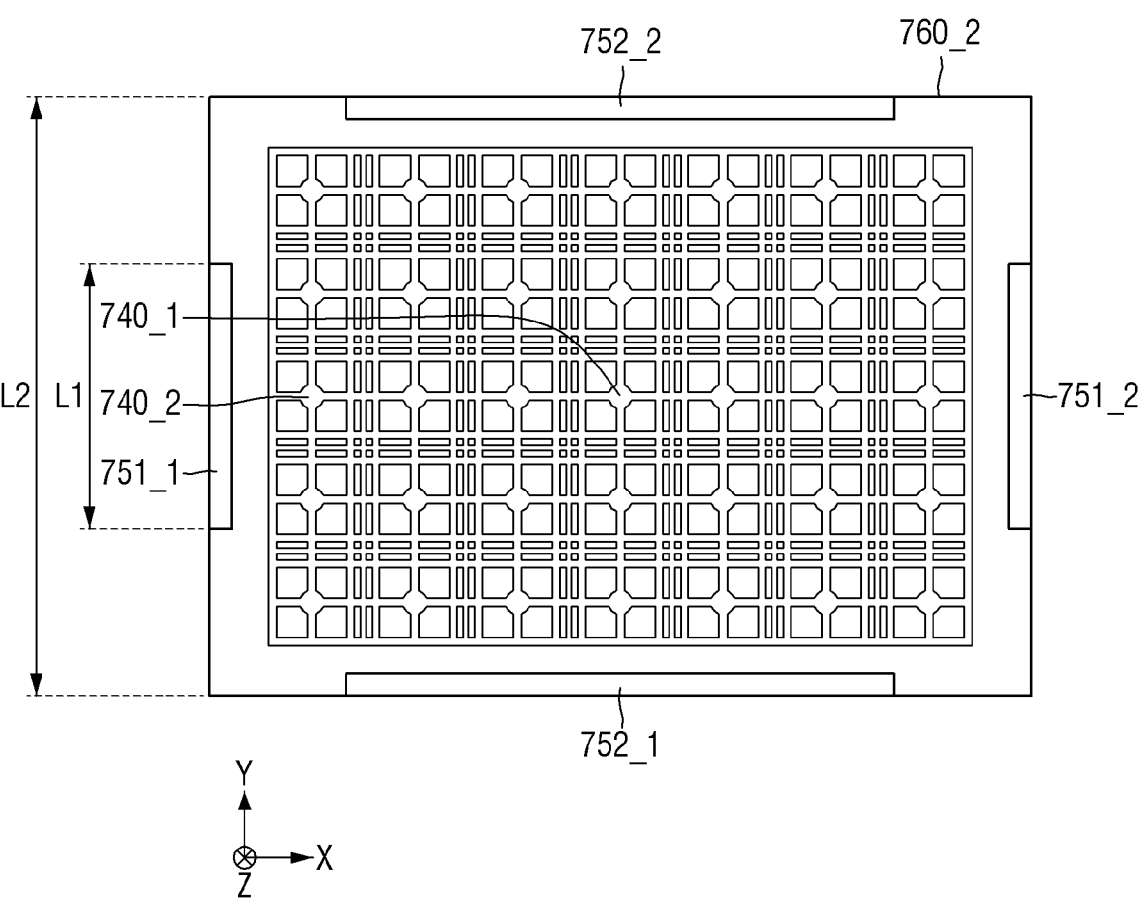
FIG. 6 is a plan view illustrating a lower surface of a bonding tool constituting a semiconductor substrate bonding device according to embodiments of the present disclosure.

FIG. 6 is a plan view illustrating a lower surface of a bonding tool constituting a semiconductor substrate bonding device according to embodiments of the present disclosure.

Figure 7:
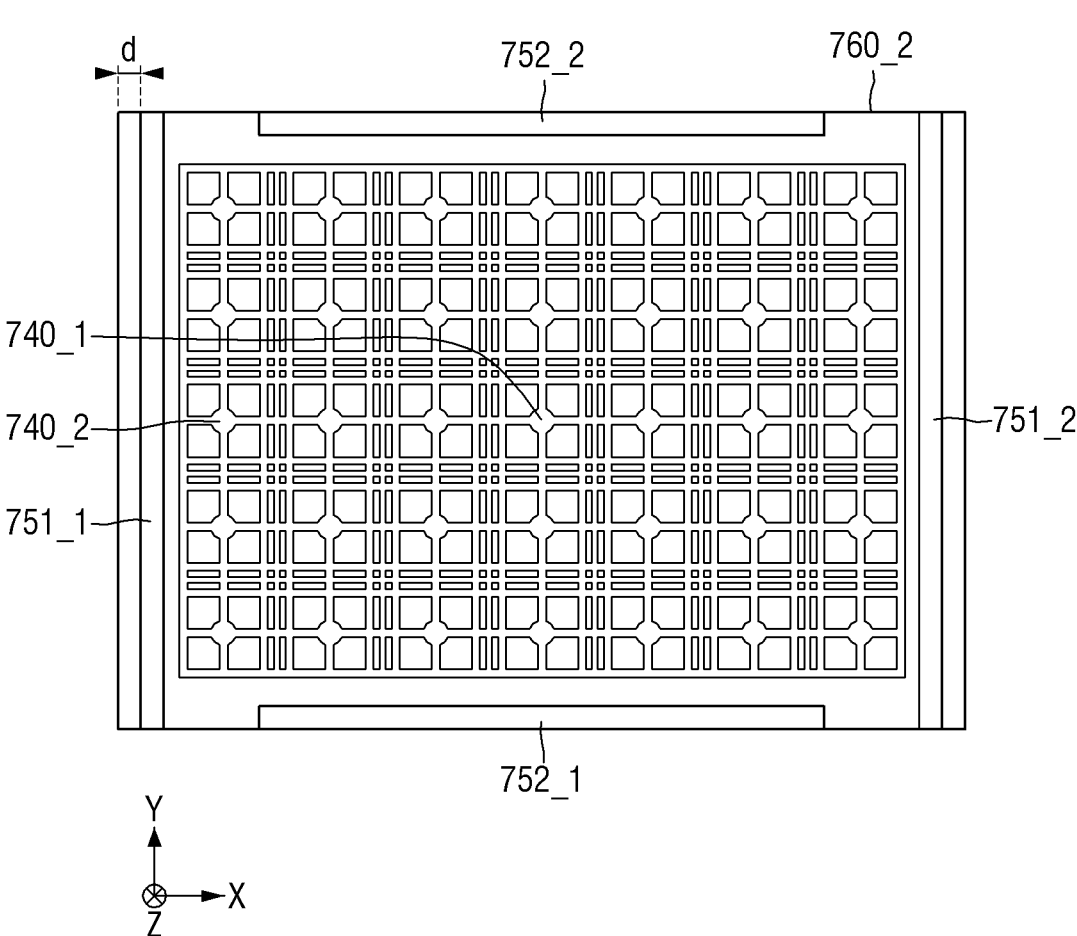
FIG. 7 is a plan view illustrating a lower surface of a bonding tool constituting a semiconductor substrate bonding device according to embodiments of the present disclosure.
Figure 8:
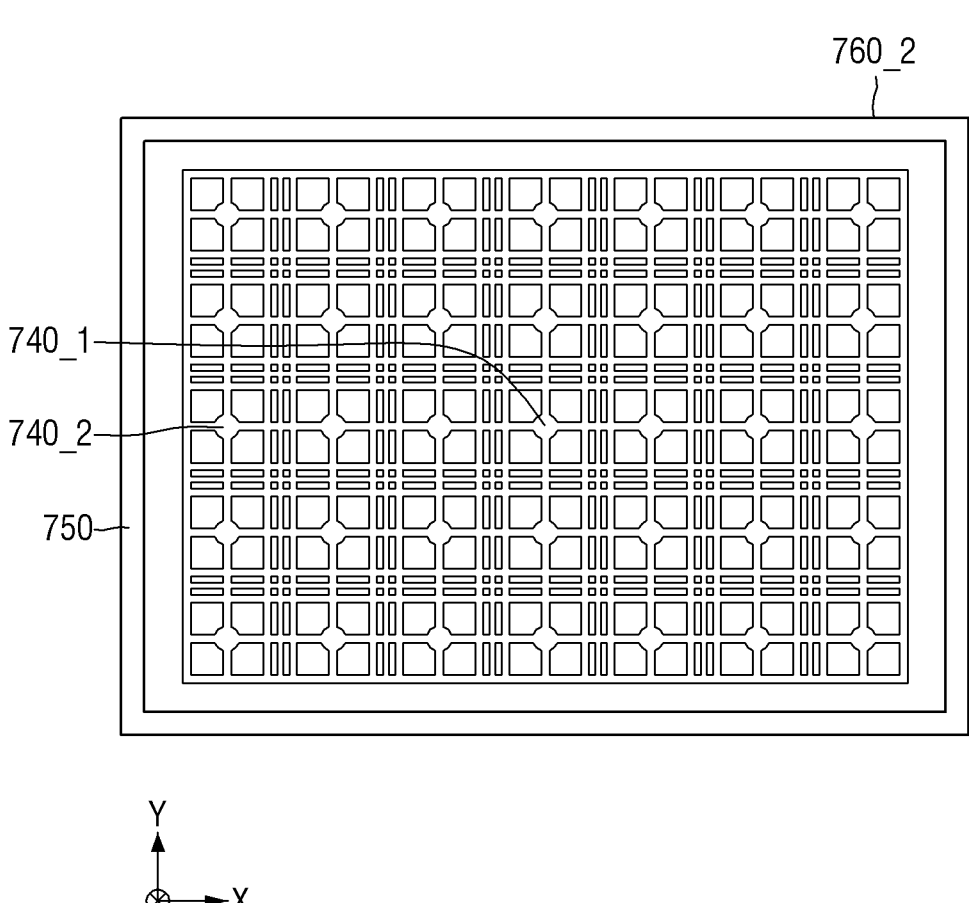
FIG. 8 is a plan view illustrating a lower surface of a bonding tool constituting a semiconductor substrate bonding device according to embodiments of the present disclosure.
Figure 9:
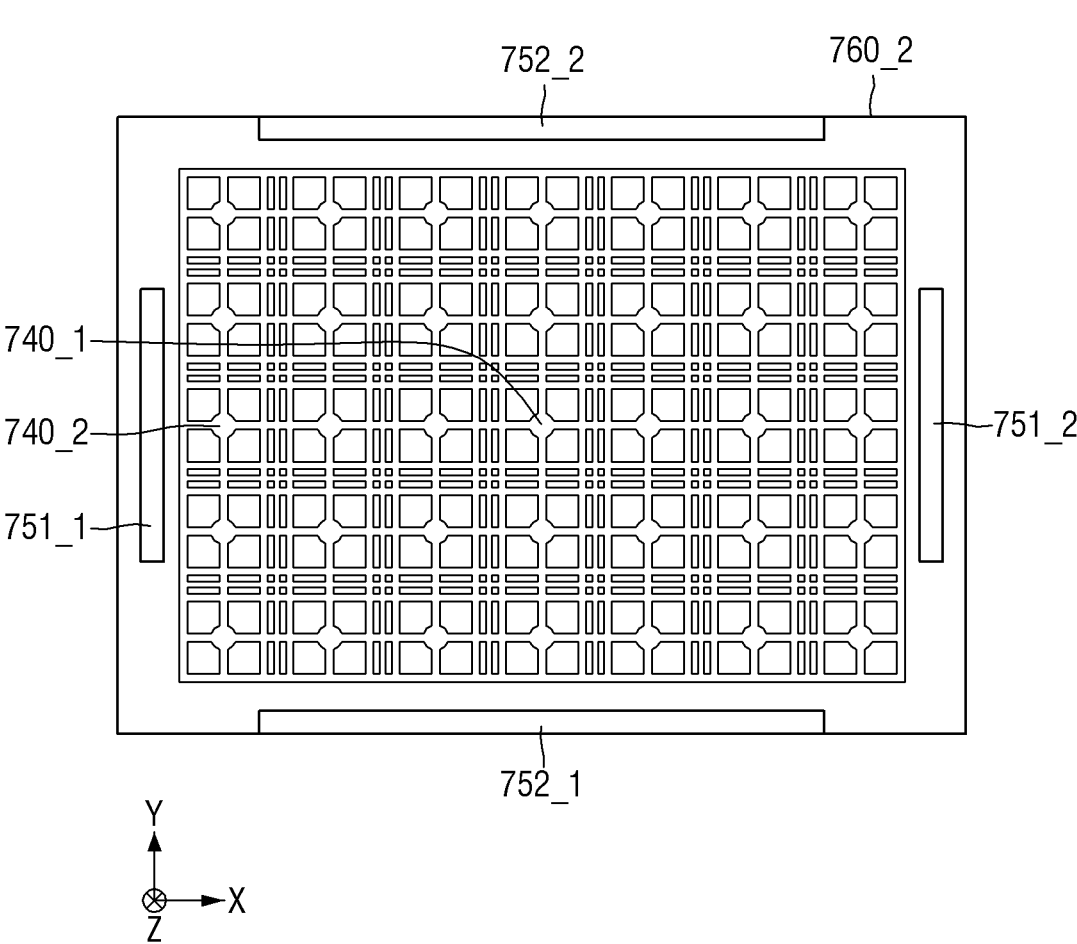
FIG. 9 is a plan view illustrating a lower surface of a bonding tool constituting a semiconductor substrate bonding device according to embodiments of the present disclosure.

FIG. 7 is a plan view illustrating a lower surface of a bonding tool constituting a semiconductor substrate bonding device according to embodiments of the present disclosure. FIG. 8 is a plan view illustrating a lower surface of a bonding tool constituting a semiconductor substrate bonding device according to embodiments of the present disclosure. FIG. 9 is a plan view illustrating a lower surface of a bonding tool constituting a semiconductor substrate bonding device according to embodiments of the present disclosure.

Referring to FIG. 6, a length of the pair of first protrusion parts 751_1 and 751_2 may be ⅓ or less of a length of the bonding tool 720. For example, a length L1 of the pair of first protrusion parts 751_1 and 751_2 extending along the second direction Y may be ⅓ or less of a length L2 of the bonding tool 720 extending along the second direction Y. In this case, an electrical interference phenomenon caused by the pair of first protrusion parts 751_1 and 751_2 and the substrate 100 adjacent to the pair of protrusion parts 751_1 and 751_2 in the first direction X may be minimized.

Referring to FIG. 7, the pair of first protrusion parts 751_1 and 751_2 may be spaced apart from an outer peripheral surface of the bonding tool 720. For example, the pair of first protrusion parts 751_1 and 751_2 may be spaced apart from the outer peripheral surface of the bonding tool 720 by a predetermined distance d along the first direction X. In this case, an electrical interference phenomenon caused by the pair of first protrusion parts 751_1 and 751_2 and the substrate 100 adjacent to the pair of protrusion parts 751_1 and 751_2 in the first direction X may be minimized.

Referring to FIG. 8, the pair of first protrusion parts 751_1 and 751_2 and the pair of second protrusion parts 752_1 and 752_2 may be arranged to extend to the outer peripheral surface of the bonding tool 720. In this case, the protrusion part 750 may be disposed in the second region A2 so as to at least partially surround the second surface 760_2 of the bonding tool 720. The protrusion part 750 may form a closed loop shape on the second surface 760_2.

However, the present disclosure is not necessarily limited thereto, and the pair of first protrusion parts 751_1 and 751_2 and the pair of second protrusion parts 752_1 and 752_2 may also be formed to be spaced apart from each other in corner regions of the second surface 760_2. In addition, the pair of first protrusion parts 751_1 and 751_2 may also be spaced apart from the outer circumferential surface of the bonding tool 720 by a predetermined distance d along the first direction X, and the pair of second protrusion parts 752_1 and 752_2 may also extend to reach the pair of first protrusion parts 751_1 and 751_2 of the bonding tool 720. In this case, the pair of second protrusion parts 752_1 and 752_2 might not reach the corner regions of the second surface 760_2.

Referring to FIG. 9, a length of the pair of first protrusion parts 751_1 and 751_2 extending along the second direction Y may be ⅓ or less of a length of the bonding tool 720 extending along the second direction Y, and at the same time, the pair of first protrusion parts 751_1 and 751_2 may be spaced apart from an outer periphery of the second surface 760_2. In this case, an electrical interference phenomenon caused by the pair of first protrusion parts 751_1 and 751_2 and the substrate 100 adjacent to the pair of protrusion parts 751_1 and 751_2 in the first direction X may be minimized.

Hereinafter, semiconductor substrate bonding devices according to embodiments of the present disclosure will be described with reference to FIGS. 10 to 16. For convenience of explanation, contents different from those of the semiconductor substrate bonding device and the semiconductor package illustrated in FIGS. 1 to 5 will be mainly described.

To the extent that one or more elements are not discussed in detail below, it may be assumed that those elements are at least similar to corresponding elements discussed elsewhere within the instant specification.

Figure 11:
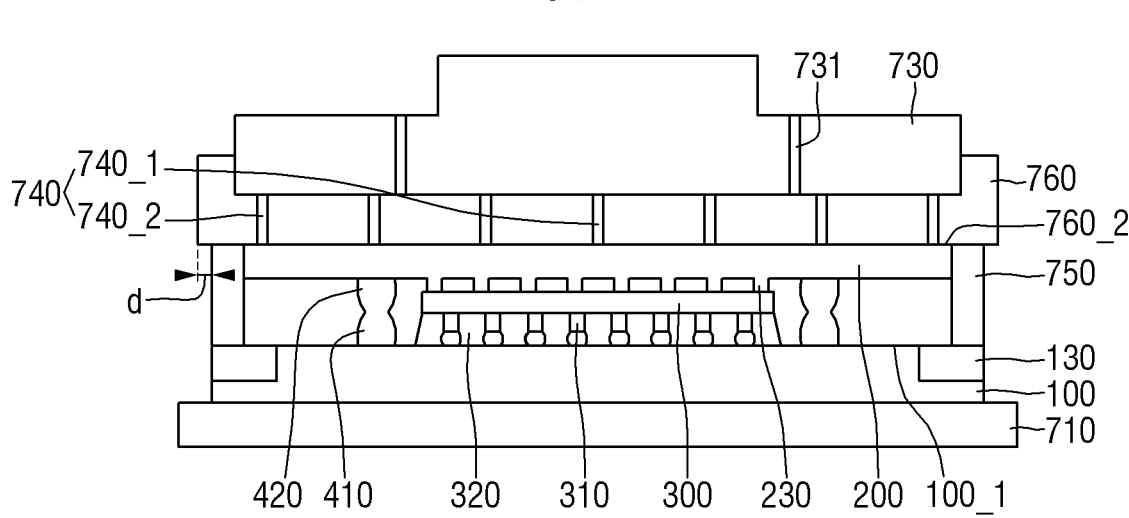
FIG. 11 is a cross-sectional schematic view illustrating structures of a semiconductor substrate bonding device and a preliminary semiconductor package according to embodiments of the present disclosure.
Figure 12:
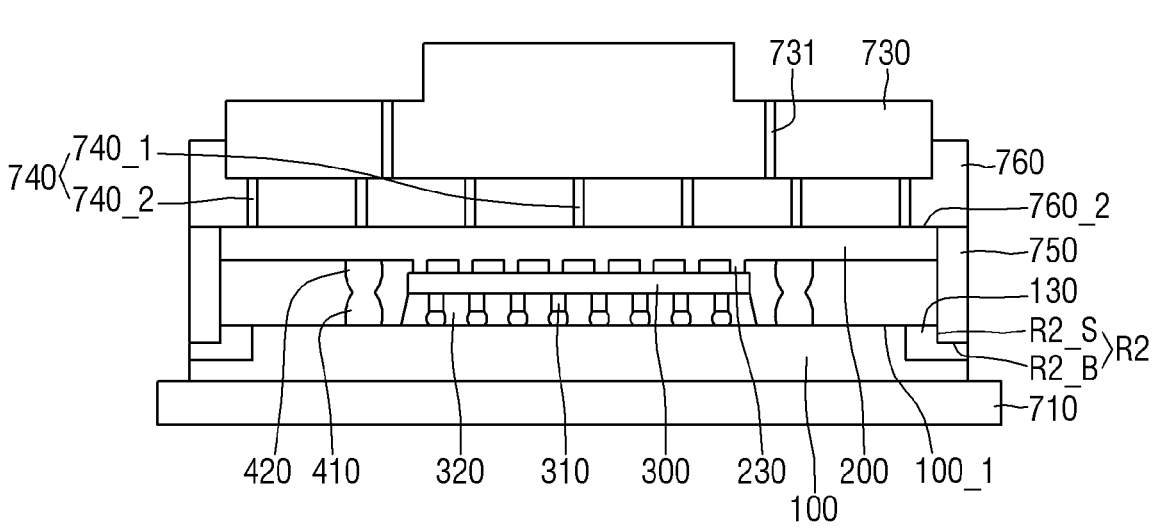
FIG. 12 is a cross-sectional schematic view illustrating structures of a semiconductor substrate bonding device and a preliminary semiconductor package according to embodiments of the present disclosure.
Figure 13:
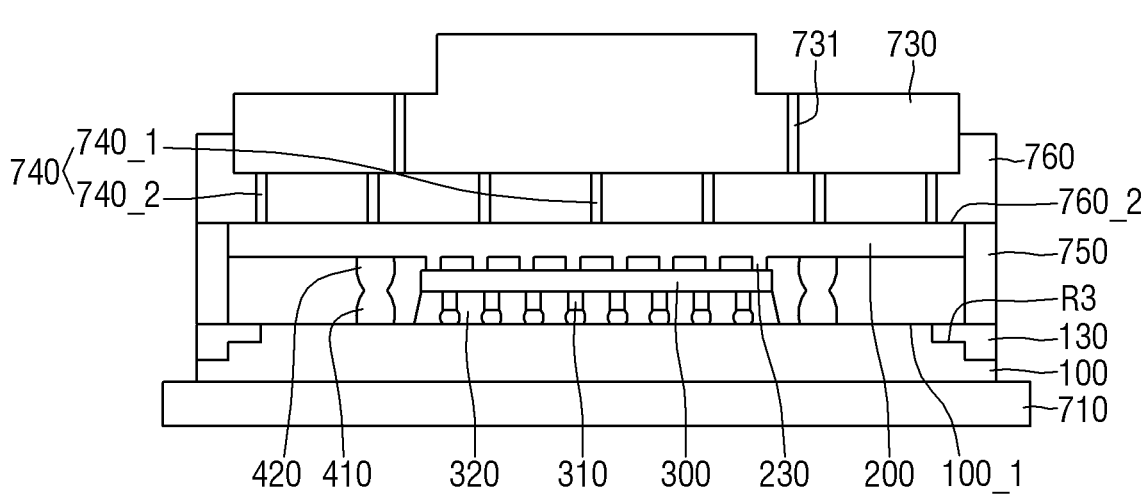
FIG. 13 is a cross-sectional schematic view illustrating structures of a semiconductor substrate bonding device and a preliminary semiconductor package according to embodiments of the present disclosure.
Figure 14:
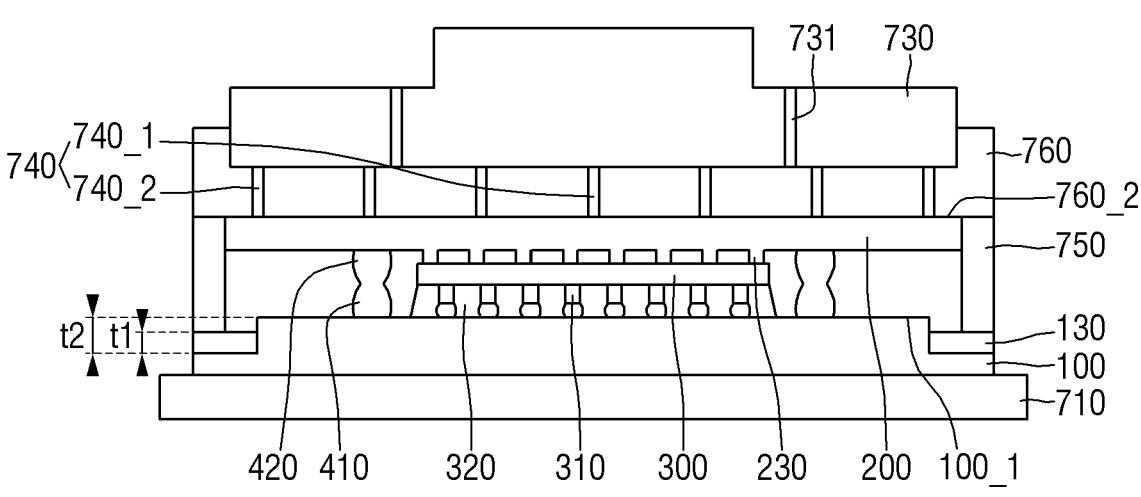
FIG. 14 is a cross-sectional schematic view illustrating structures of a semiconductor substrate bonding device and a preliminary semiconductor package according to embodiments of the present disclosure.
Figure 15:
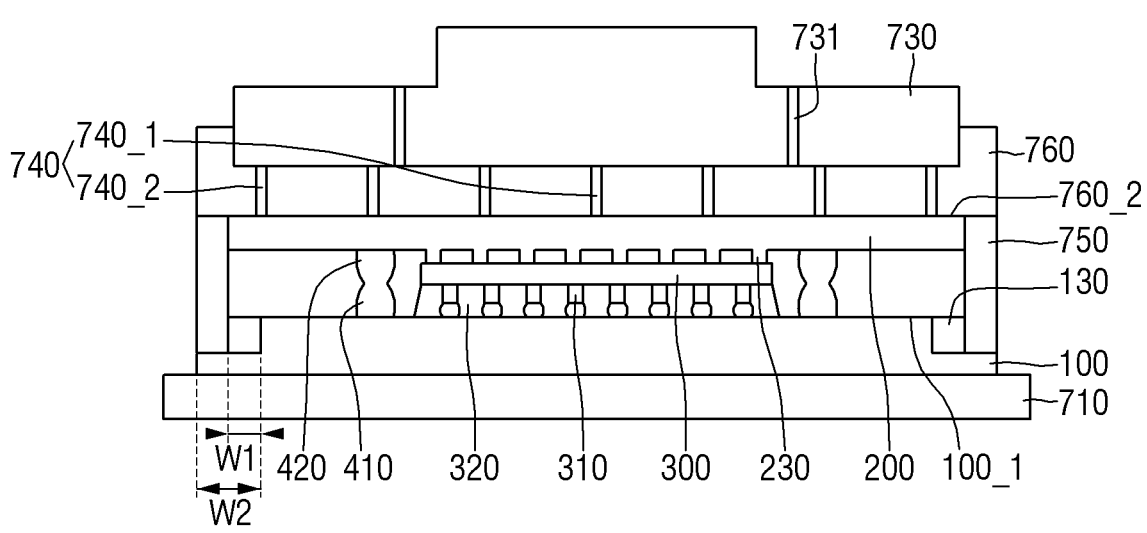
FIG. 15 is a cross-sectional schematic view illustrating structures of a semiconductor substrate bonding device and a preliminary semiconductor package according to embodiments of the present disclosure.
Figure 16:
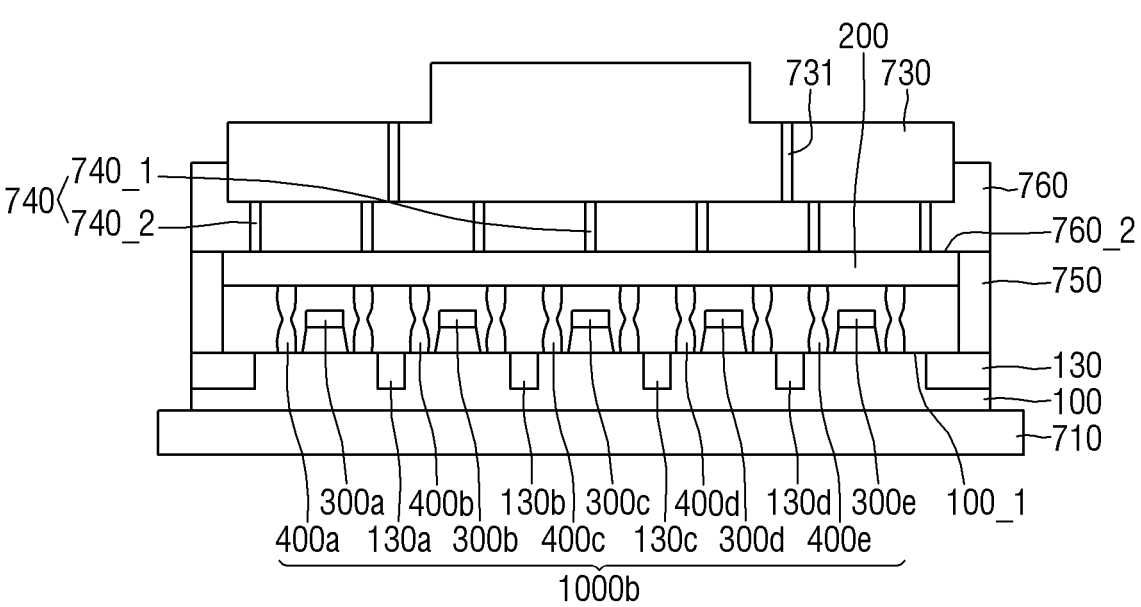
FIG. 16 is a cross-sectional schematic view illustrating structures of a semiconductor substrate bonding device and a preliminary semiconductor package according to embodiments of the present disclosure.

FIG. 10 is a schematic cross-sectional view illustrating structures of a semiconductor substrate bonding device and a preliminary semiconductor package according to embodiments of the present disclosure. FIG. 11 is a schematic cross-sectional view illustrating structures of a semiconductor substrate bonding device and a preliminary semiconductor package according to embodiments of the present disclosure. FIG. 12 is a schematic cross-sectional view illustrating structures of a semiconductor substrate bonding device and a preliminary semiconductor package according to embodiments of the present disclosure. FIG. 13 is a schematic cross-sectional view illustrating structures of a semiconductor substrate bonding device and a preliminary semiconductor package according to embodiments of the present disclosure. FIG. 14 is a schematic cross-sectional view illustrating structures of a semiconductor substrate bonding device and a preliminary semiconductor package according to embodiments of the present disclosure. FIG. 15 is a schematic cross-sectional view illustrating structures of a semiconductor substrate bonding device and a preliminary semiconductor package according to embodiments of the present disclosure. FIG. 16 is a schematic cross-sectional view illustrating structures of a semiconductor substrate bonding device and a preliminary semiconductor package according to embodiments of the present disclosure.

FIGS. 10 to 16 are cross-sectional views corresponding to schematic views illustrating structures of semiconductor substrate bonding devices and preliminary semiconductor packages according to embodiments, taken along line I-I' of FIG. 2.

Referring to FIG. 10, a preliminary semiconductor package 1000*a* includes a substrate 100 to which a pad part 130 is attached, an interposer 200 disposed on the substrate 100, and a semiconductor chip 300 disposed between the substrate 100 and the interposer 200. In addition, the preliminary semiconductor package 1000*a* may further include preliminary connection members 410 and 420 electrically connecting the substrate 100 and the interposer 200 to each other.

The substrate 100 includes a first surface 100_1 on which the semiconductor chip 300 is mounted and which faces the interposer 200 and a second surface 100_2 facing the first surface 100_1.

The pad part 130 may correspond to the second region A2 of the bonding tool 720. In addition, the protrusion part 750 and the pad part 130 may be in direct contact with each other. In some embodiments, the term "correspond" means that two parts are disposed on a straight line along a direction parallel to the third direction Z. However, also in this case, each of the protrusion part 750 and the pad part 130 may be disposed in a region overlapping the second region A2.

The pad part 130 is disposed in a recess R1 formed at an edge of the substrate 100 so as to expose at least a portion of an inner surface of the substrate 100. Referring to FIG. 3, the recess R1 includes a sidewall R1_S exposing at least a portion of the inner surface of the substrate 100 in an edge region of the substrate 100 and a bottom surface R1_B connected to the sidewall R1_S. The pad part 130 may be disposed on the sidewall R1_S and the bottom surface R1_B of the recess. A width of the pad part 130 may be the same as a width of the recess R1 of the substrate 100.

In some embodiments, the edge region of the substrate 100 may refer to a region corresponding to the second region A2 of the bonding tool 720. For example, the edge region of the substrate 100 may be a region overlapping the second region A2 of the bonding tool 720.

The pad part 130 includes a pair of first pad parts 131_1 and 131_2 facing each other in the first direction X and a pair of second pad protrusion parts 132_1 and 132_2 facing each other in the second direction Y. The pair of first pad parts 131_1 and 131_2 may correspond to the pair of first protrusion parts 751_1 and 751_2, and the pair of second pad parts 132_1 and 132_2 may correspond to the pair of second protrusion parts 752_1 and 752_2.

In this case, the pair of first pad parts 131_1 and 131_2 may have the same thickness as each other, and the pair of second pad parts 132_1 and 132_2 may have the same thickness as each other. In addition, the thickness of the pair of first pad parts 131_1 and 131_2 and the thickness of the pair of second pad parts 132_1 and 132_2 may be different from each other. For example, the protrusion parts 750 and the pad parts 130 facing each other in the first direction X or the second direction Y may have the same thickness and width.

An upper surface of the pad part 130 may be disposed on the same surface as the first surface 100_1 of the substrate 100. Alternatively, the upper surface of the pad part 130 may be disposed at a height lower than the first surface 100_1 of the substrate 100. For example, the pad part 130 may be formed to have a thickness t1 of 200 μm or less from the first surface 100_1 of the substrate 100. However, the present disclosure is not necessarily limited thereto.

The pad part 130 may include a metal material. For example, the pad part 130 may include copper (Cu) or non-ferrous metals other than copper. However, the present disclosure is not necessarily limited thereto. When the pad part 130 includes the metal material, deformation of the substrate 100 due to heat and pressure at the time of TC bonding may be minimized.

The pad part 130 may be formed by exposing and/or developing the substrate 100 using a mask formed on the substrate 100. However, a method of forming the pad part 130 is not necessarily limited thereto.

Referring to FIG. 11, the pair of first protrusion parts 751_1 and 751_2 may be spaced apart from an outer peripheral surface of the bonding tool 720. For example, the pair of first protrusion parts 751_1 and 751_2 may be disposed inside from the outer peripheral surface of the bonding tool 720 by a predetermined distance d along the first direction X. In this case, an electrical interference phenomenon caused by the pair of first protrusion parts 751_1 and 751_2 and the substrate 100 adjacent to the pair of protrusion parts 751_1 and 751_2 in the first direction X may be minimized.

Referring to FIG. 12, the pad part 130 includes at least one bent part (e.g., an elbow). The pad part 130 includes a recess R2 having a bottom surface R2_B in contact with the pair of first protrusion parts 751_1 and 751_2 and a sidewall R2_S connected to the bottom surface R2_B. The bent part may be formed on the recess R2. In this case, as a thickness of the pad part 130 decreases, a thickness of the pair of first protrusion parts 751_1 and 751_2 may increase as compared with FIG. 10.

Referring to FIG. 13, the pad part 130 includes at least one bent part. In this case, a multi-stage recess R3 may be formed in the substrate 100, and a bent part may be disposed on the multi-stage recess R3.

Referring to FIG. 14, a thickness t1 of the pad part 130 may be smaller than a thickness t2 of the substrate 100. For example, an upper surface of the pad part 130 may be disposed at a position lower than an upper surface of the substrate 100. In this case, as a thickness of the pad part 130 decreases, a thickness of the first protrusion parts 751_1 and 751_2 may increase as compared with FIG. 10.

Referring to FIG. 15, the pad part 130 might not be disposed below the first protrusion parts 751_1 and 751_2, and may be disposed on side portions of the first protrusion parts 751_1 and 751_2. For example, the pad part 130 might not be in contact with lower surfaces of the first protrusion parts 751_1 and 751_2, and may be in contact with side surfaces of the first protrusion parts 751_1 and 751_2.

A width W1 of the pad part 130 may be smaller than a width W2 of the recess of the substrate 100. In this case, the first protrusion parts 751_1 and 751_2 may be in contact with one surface of the substrate 100 exposed by the recess of the substrate 100.

The preliminary semiconductor package 1000a, which is a large-area product, is formed by the semiconductor substrate bonding device 1000B described above. Hereinafter, a preliminary semiconductor package 1000b, which is a small-area product formed by the semiconductor substrate bonding device, will be described.

Referring to FIG. 16, a preliminary semiconductor package 1000b and a plurality of pad parts 130a, 130b, 130c, and 130d may be disposed on the substrate 100. The preliminary semiconductor package 1000b includes the substrate 100 to which the plurality of pad parts 130a, 130b, 130c, and 130d are attached, an interposer 200 disposed on the substrate 100, and a plurality of semiconductor chips 300a, 300b, 300c, 300d, and 300e disposed between the substrate 100 and the interposer 200. In addition, the preliminary semiconductor package 1000b may further include a plurality of preliminary connection members 400a, 400b, 400c, 400d, and 400e electrically connecting the substrate 100 and the interposer 200 to each other. Each of the plurality of pad parts 130a, 130b, 130c, and 130d may be disposed between the plurality of semiconductor chips 300a, 300b, 300c, 300d, and 300e.

In this case, after the substrate 100 and the interposer 200 are bonded to each other by TC bonding, the preliminary semiconductor package 1000b may be divided into a plurality of semiconductor packages. A description for a semiconductor package 1000A of FIG. 17 to be provided later may be similarly applied, except that each of the divided semiconductor packages is a small-area product.

Figure 17:
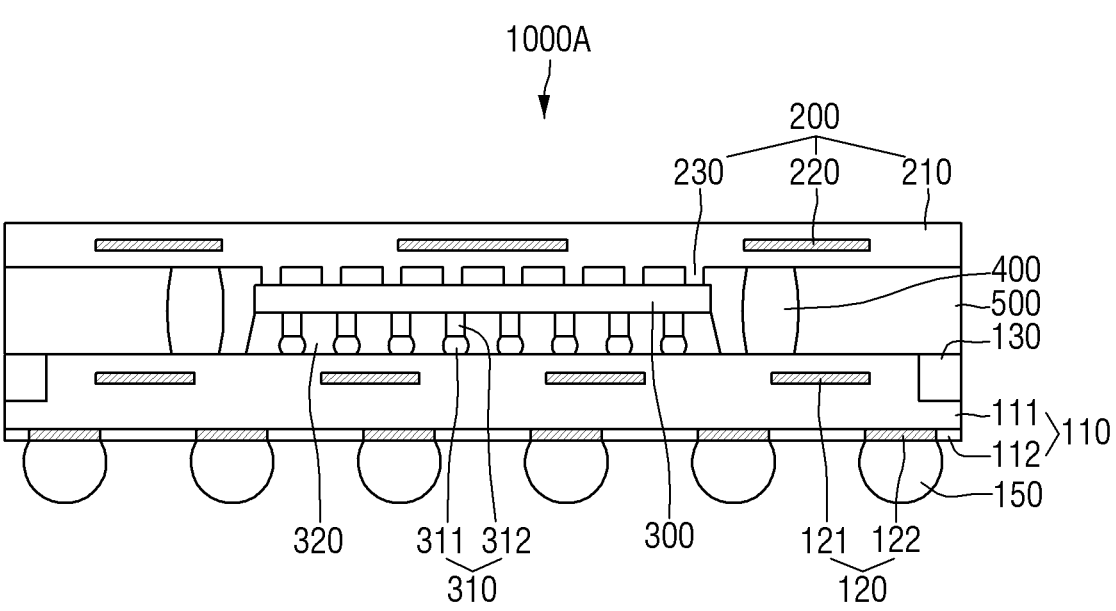
FIG. 17 is a cross-sectional schematic view illustrating structures of a semiconductor package according to embodiments of the present disclosure.

FIG. 17 is a schematic view illustrating structures of a semiconductor package according to some embodiments of the present disclosure. In this case, the description for FIGS. 10 to 16 may be similarly applied.

Referring to FIG. 17, a semiconductor package 1000A fabricated using the semiconductor substrate bonding device according to some embodiments includes a substrate 100, an interposer 200, a semiconductor chip 300, and connection members 400, and further includes a mold layer 500.

Referring to FIGS. 3 and 17 together, a recess R1 exposing at least one side surface of the substrate 100 is formed at an edge of the substrate 100, and the pad part 130 is disposed in the recess R1. As a description for the recess R1 and the pad part 130, the description for the recess R1 and the pad part 130 of the preliminary semiconductor package 1000a of FIGS. 1 to 16 may be similarly applied.

The substrate 100 includes a first insulating layer 110, a pad part 130, and a first wiring layer 120 spaced apart from the pad part 130.

The first insulating layer 110 may include an insulating film 111 and a passivation film 112 disposed under the insulating film 111. The insulating film 111 may be, for example, a printed circuit board (PCB) or a ceramic substrate. However, the technical spirit of the present disclosure is not necessarily limited thereto.

The first wiring layer 120 may include lower pads 122 exposed by the passivation film 112 and a plurality of wiring pads 121 electrically connected to the lower pads 122.

When the insulating film 111 is the printed circuit board, the insulating film 111 may be made of a phenolic resin, an epoxy resin, and/or polyimide. For example, the insulating film 111 may include FR-4, tetrafunctional epoxy, polyphenylene ether, epoxy/polyphenylene oxide, bismaleimide triazine (BT), thermount, cyanate ester, polyimide, and/or liquid crystal polymer.

A surface of the insulating film 111 may be covered by a solder resist. For example, the passivation film 112 formed on the surface of the insulating film 111 may be a solder resist. In this case, the passivation film 112 may include a photosensitive insulating material. However, the present disclosure is not necessarily limited thereto.

Connection terminals 150 may be formed on a lower surface of the first insulating layer 110. The connection terminals 150 may be attached to the lower pads 122. The connection terminal 150 may have, for example, a spherical shape or an elliptical spherical shape, but is not necessarily limited thereto. The connection terminal 150 may include, for example, tin (Sn), indium (In), lead (Pb), zinc (Zn), nickel (Ni), gold (Au), silver (Ag), copper (Cu), antimony (Sb), bismuth (Bi), and/or combinations thereof, but is not necessarily limited thereto.

The connection terminal 150 may electrically connect the substrate 100 to an external device. Accordingly, the connection terminal 150 may provide an electrical signal to the substrate 100 or an electrical signal provided from the substrate 100 to the external device.

The semiconductor chip 300 may be disposed on the substrate 100. For example, the semiconductor chip 300 may be mounted on an upper surface of the substrate 100. The semiconductor chip 300 may include an integrated circuit (IC) provided in an amount of several hundred to several million or more semiconductor elements integrated in a single chip. For example, the semiconductor chip 300 may be an application processor (AP) such as a central processing unit) (CPU), a graphic processing unit (GPU), a field programmable gate array (FPGA), a digital signal processor, an encryption processor, a microprocessor, or a microcontroller, but is not necessarily limited thereto. For example, the semiconductor chip 300 may be a logic chip such as an analog-digital converter (ADC) or an application-specific IC (ASIC), and may be a memory chip such as a volatile memory (e.g., a dynamic random access memory (DRAM)) or a non-volatile memory (e.g., a read only memory (ROM) or a flash memory). In addition, the semiconductor chip 300 may be configured by a combination of these chips.

Although it is illustrated that only one semiconductor chip 300 is formed on the substrate 100, this is only for convenience of explanation. For example, a plurality of semiconductor chips 300 may be formed side by side on the substrate 100 or may be sequentially stacked on the substrate 100.

In this case, the semiconductor chip 300 may include a first semiconductor chip and a second semiconductor chip stacked on the first semiconductor chip. The first semiconductor chip may include a first substrate on which a first semiconductor element is disposed. The second semiconductor chip may include a second substrate on which a second semiconductor element is disposed.

The second semiconductor chip and the first semiconductor chip may be electrically connected to each other by a conductive structure penetrating through the first substrate. For example, the conductive structure may have a shape of a cupper post filled with copper (Cu). However, the shape of the conductive structure is not necessarily limited thereto.

For example, an insulating material may be formed between a lower surface of the second substrate and an upper surface of the first substrate, and one or more bonding pads may be formed in the insulating material. The bonding pad may be coupled to the conductive structure to electrically connect the first semiconductor chip and the second semiconductor chip to each other.

The semiconductor chip 300 may be mounted on the substrate 100 in a flip chip bonding manner. For example, bumps 310 may be formed between the upper surface of the substrate 100 and a lower surface of the semiconductor chip 300. The bumps 310 may electrically connect the substrate 100 and the semiconductor chip 300 to each other.

The bump 310 may include, for example, a pillar layer 312 and a solder layer 311.

The pillar layer 312 may protrude from the lower surface of the semiconductor chip 300. The pillar layer 312 may include, for example, copper (Cu), a copper alloy, nickel (Ni), palladium (Pd), platinum (Pt), gold (Au), cobalt (Co), and/or combinations thereof, but the present disclosure is not necessarily limited thereto.

The solder layer 311 may connect the pillar layer 312 and the substrate 100 to each other. The solder layer 311 may be electrically connected to a portion of the first wiring layer 120. The solder layer 311 may have, for example, a spherical shape or an elliptical spherical shape, but is not necessarily limited thereto. The solder layer 311 may include, for example, tin (Sn), indium (In), bismuth (Bi), antimony (Sb), copper (Cu), silver (Ag), zinc (Zn), lead (Pb), and/or combinations thereof, but is not necessarily limited thereto.

The interposer 200 may be disposed on upper surfaces of the substrate 100 and the semiconductor chip 300. The interposer 200 may be spaced apart from the substrate 100 and the semiconductor chip 300.

The interposer 200 includes a second insulating layer 210 and a second wiring layer 220. The second insulating layer 210 may include an insulating film, which is a printed circuit board (PCB) or a ceramic substrate. However, the technical spirit of the present disclosure is not necessarily limited thereto. In some embodiments, the interposer 200 may include silicon (Si).

The second insulating layer 210 may include an insulating film and passivation films disposed on or under the insulating film. The passivation film formed on a surface of the insulating film may be a solder resist. The second wiring layer 220 may include a plurality of wiring pads disposed inside the second insulating layer 210.

The interposer 200 may include a plurality of protrusion patterns 230. The protrusion patterns 230 may serve to keep a distance between the interposer 200 and the semiconductor chip 300 constant.

The connection members 400 may be interposed between the substrate 100 and the interposer 200. The connection members 400 may be in contact with the upper surface of the substrate 100 and a lower surface of the interposer 200. For example, the connection members 400 may be electrically connected to the first wiring layer 120 of the substrate 100.

Accordingly, the connection members 400 may electrically connect the substrate 100 and the interposer 200 to each other.

The connection member 400 may have, for example, a spherical shape or an elliptical spherical shape, but is not necessarily limited thereto. The connection member 400 may include, for example, tin (Sn), indium (In), bismuth (Bi), antimony (Sb), copper (Cu), silver (Ag), zinc (Zn), lead (Pb), and/or combinations thereof, but is not necessarily limited thereto.

The mold layer 500 may be formed on the substrate 100. The mold layer 500 may fill a space between the substrate 100 and the interposer 200. Accordingly, the mold layer 500 may cover and protect at least portions of the substrate 100 and the semiconductor chip 300.

The mold layer 500 may include, for example, an insulating polymer material such as an epoxy molding compound (EMC). The mold layer 500 may include a thermosetting resin such as an epoxy resin, a thermoplastic resin such as polyimide, or a resin having a reinforcing material such as a filler impregnated in the thermosetting resin and the thermoplastic resin, for example, Ajinomoto Build-up Film (ABF), FR-4, or a Bismaleimide Triazine (BT) resin.

A material of the filler may include silica ($SiO_2$), alumina ($Al_2O_3$), silicon carbide (SiC), barium sulfate ($BaSO_4$), talc, clay, mica powders, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and/or calcium zirconate ($CaZrO_3$) However, the material of the filler is not necessarily limited thereto.

An underfill material 320 may cover side surfaces of the bumps 310. The underfill material 320 may prevent the semiconductor chip 300 from being broken by fixing the semiconductor chip 300 onto the substrate 100. The underfill material 320 may include, for example, an insulating polymer material such as an epoxy molding compound (EMC). However, the present disclosure is not necessarily limited thereto, and the underfill material 320 may also include a material different from that of the mold layer 500.

FIG. 18 is a flowchart illustrating a method of fabricating a semiconductor package using the semiconductor substrate bonding device according to embodiments of the present disclosure. For convenience of explanation, contents different from those of the semiconductor substrate bonding device, the preliminary semiconductor package, and the semiconductor package illustrated in FIGS. 1 to 17 will be mainly described. To the extent that one or more elements are not discussed in detail below, it may be assumed that those elements are at least similar to corresponding elements discussed elsewhere within the instant specification.

Referring to FIGS. 1 and 18 together, the preliminary semiconductor package 1000a or 1000b including the substrate 100 to which the pad part 130 is attached, the interposer 200 disposed on the substrate 100, and the semiconductor chip 300 disposed between the substrate 100 and the interposer 200 is disposed on a stage 710 (Step S1).

The bonding tool 720 including the first region A1 and the second region A2 outside the first region A1 on the second surface 760_2 thereof facing the interposer 200 is disposed on the interposer 200 (Step S2). The bonding tool 720 may further include the plurality of holes 740 penetrating through the bonding tool 720, and the bonding tool 720 may adsorb the interposer 200 through the plurality of holes 740.

The second region A2 of the bonding tool 720 is disposed to correspond to the pad part 130, and the interposer 200 and the substrate 100 are bonded to each other (Step S3). Here, bonding the interposer 200 and the substrate 100 to each other may be performed by bonding a first preliminary connection member 410 formed on the substrate 100 and a second preliminary connection member 420 formed on the interposer 200 to each other using a TC bonding process.

The bonding tool 720 further includes the protrusion part 750 formed in the second region A2 and protruding from the second surface 760_2 of the bonding tool 720. In a plan view, the bonding tool 720 extends in each of the first direction X and the second direction Y crossing the first direction X, and the protrusion part 750 includes the pair of first protrusion parts 751_1 and 751_2 facing each other in the first direction X and the pair of second protrusion parts 752_1 and 752_2 facing each other in the second direction Y. The pair of first protrusion parts 751_1 and 751_2 may have the same thickness as each other, and the pair of second protrusion parts 752_1 and 752_2 may have the same thickness as each other. Referring to FIGS. 7 and 11 together, on the basis of the first direction X, the pair of first protrusion parts 751_1 and 751_2 may be spaced apart from the outer peripheral surface of the bonding tool 720.

The protrusion part 750 is in contact with the pad part 130. The thickness T of the protrusion part 750 may be the same as a distance between a surface of the substrate 100 and the second surface 760_2.

The pad part 130 includes the pair of first pad parts 131_1 and 131_2 facing each other in the first direction X and the pair of second pad protrusion parts 132_1 and 132_2 facing each other in the second direction Y. The pair of first pad parts 131_1 and 131_2 may correspond to the pair of first protrusion parts 751_1 and 751_2, and the pair of second pad parts 132_1 and 132_2 may correspond to the pair of second protrusion parts 752_1 and 752_2. The thickness of the pair of first pad parts 131_1 and 131_2 and the thickness of the pair of second pad parts 132_1 and 132_2 may be different from each other. For example, the pair of first pad parts 131_1 and 131_2 and the pair of second pad parts 132_1 and 132_2 may be formed to be asymmetrical to each other, on the second surface 760_2 of the bonding tool 720 illustrated in FIGS. 5 to 9. However, also in this case, the pair of first pad parts 131_1 and 131_2 and/or the pair of second pad parts 132_1 and 132_2 may be symmetrical to each other.

The pad part 130 is disposed in the recess R1 formed at the edge of the substrate 100. For example, the second region A2 of the bonding tool 720 may correspond to the recess R1. In this case, the pad part 130 may be formed to a thickness of 200 μm or less from the surface of the substrate 100. Referring to FIGS. 12 and 13 together, the pad part 130 may include at least one bent part. The pad part 130 may include a metal material.

The preliminary semiconductor package 1000a or 1000b is separated from the bonding unit 700 and is then divided into semiconductor packages 1000A which are respective unit structures (Step S4). After a residual contaminant around the connection members 400 or a cleaning material for removing the contaminant is completely removed, the mold layer 500 may be filled between the substrate 100 and the interposer 200 of the preliminary semiconductor package 1000a or 1000b.

The dividing of the preliminary semiconductor package 1000a or 1000b into the semiconductor packages 1000A may include dicing the preliminary semiconductor package 1000a or 1000b into the respective semiconductor packages 1000A along the first direction X or the second direction Y of the second vacuum lines 742 illustrated in FIG. 5. In this case, at least some of the second vacuum lines 742 may function as dicing lines.

The protrusion part 750 formed in the outer region A2 of the bonding tool 720 and the pad part 130 formed on the substrate 100 are disposed to correspond to each other, such that the interposer 200 and the substrate 100 may be bonded to each other without using copper core balls. As a result, processes of attaching the copper core balls and solder balls to the interposer may be simplified. In addition, a problem that reliability of a component is decreased as cracks occur in the copper core balls due to thermal compression may be prevented. Furthermore, thermal deformation of the component may be minimized by forming a metallic pad part 130 on the substrate 100. Accordingly, a gap between the substrate 100 and the interposer 200 may be suitably maintained.

Various embodiments of the present disclosure have been described hereinabove with reference to the accompanying drawings, but the present disclosure is not necessary limited to the above-described embodiments, and may be implemented in various different forms, and one of ordinary skill in the art to which the present disclosure pertains may understand that the present disclosure may be implemented in other specific forms without changing the technical spirit or essential features of the present disclosure.

What is claimed is:

1. A method of fabricating a semiconductor package, comprising:

disposing a preliminary semiconductor package on a stage, the preliminary semiconductor package including a substrate to which a pad part is attached, an interposer disposed on the substrate, and a semiconductor chip disposed between the substrate and the interposer;

disposing a bonding tool on the interposer, the bonding tool including a first region and a second region outside of the first region, the first region and the second region being adjacent regions of a single flat plate structure; and disposing the second region of the bonding tool so as to correspond to the pad part and bonding the interposer and the substrate to each other;

wherein the pad part includes a pair of first pad parts facing each other in a first direction and a pair of second pad parts facing each other in a second direction, and wherein the pair of first pad parts have a height different from that of the pair of a second pad parts.

2. The method of fabricating a semiconductor package of claim 1, wherein the bonding tool further includes a protrusion part formed in the second region and protruding from the bonding tool, and wherein the protrusion part is in contact with the pad part.

3. The method of fabricating a semiconductor package of claim 2, wherein a thickness of the protrusion part is the same as a distance between a surface of the substrate and a surface of the bonding tool.

4. The method of fabricating a semiconductor package of claim 2, wherein the bonding tool extends in each of the first direction and the second direction crossing the first direction, wherein the protrusion part includes a pair of first protrusion parts facing each other in the first direction and a pair of second protrusion parts facing each other in the second direction, and wherein the pair of first protrusion parts have the same height as each other, and the pair of second protrusion parts have the same height as each other.

5. The method of fabricating a semiconductor package of claim 4, wherein with respect to the first direction, the pair of first protrusion parts are spaced apart from an outer peripheral surface of the bonding tool.

6. The method of fabricating a semiconductor package of claim 4, wherein the pair of first pad parts correspond to the pair of first protrusion parts, and the pair of second pad parts correspond to the pair of second protrusion parts.

7. The method of fabricating a semiconductor package of claim 1, wherein the bonding tool further includes a plurality of holes penetrating through the bonding tool, and wherein the bonding tool adsorbs the interposer through the plurality of holes.

8. The method of fabricating a semiconductor package of claim 1, wherein a recess exposing at least a portion of an inner surface of the substrate is formed at an edge of the substrate, and wherein the pad part is disposed within the recess such that a top surface of the pad part is level with a top surface of the substrate.

9. The method of fabricating a semiconductor package of claim 1, wherein the pad part includes at least one bent part.

10. The method of fabricating a semiconductor package of claim 1, wherein the pad part is formed to a thickness of 200 μm or less.

11. The method of fabricating a semiconductor package of claim 1, wherein the pad part includes a metal material.

12. A method of fabricating a semiconductor package, comprising:

disposing a preliminary semiconductor package on a stage, the preliminary semiconductor package including a substrate to which a pad part is attached, an interposer disposed on the substrate, and a semiconductor chip disposed between the substrate and the interposer;

disposing a bonding tool on the interposer, the bonding tool including a first region and a second region outside the first region; and disposing the second region of the bonding tool so as to correspond to the pad part and bonding the interposer and the substrate to each other, wherein the bonding tool further includes a protrusion part formed in the second region and protruding from the bonding tool, wherein the protrusion part is in contact with the pad part, wherein the bonding tool extends in each of a first direction and a second direction crossing the first direction, wherein the protrusion part includes a pair of first protrusion parts facing each other in the first direction and a part of second protrusion parts facing each other in the second direction, wherein the pair of the first protrusion parts have the same height as each other, and the pair of second protrusion parts have the same height as each other, wherein the pad part includes a pair of first pad parts facing each other in the first direction and a part of second pad parts facing each other in the second direction, wherein the pair of first pad parts correspond to the pair of first protrusion parts, and the pair of second pad parts correspond to the pair of second protrusion parts, and wherein the pair of first pad parts have a height different from that of the pair of a second pad parts.

13. A method of fabricating a semiconductor package, comprising:

disposing a preliminary semiconductor package on a stage, the preliminary semiconductor package including a substrate having a recess formed therein, an interposer disposed on the substrate, and a semiconductor chip disposed between the substrate and the interposer;

disposing a bonding tool on the interposer, the bonding tool including a first region and a second region outside of the first region, the first region and the second region being adjacent regions of a single flat plate structure; and disposing the second region of the bonding tool so as to correspond to the recess and bonding the interposer and the substrate to each other;

wherein the substrate includes a pad part and the pad part includes a pair of first pad parts facing each other in a first direction and a pair of second pad parts facing each other in a second direction, and wherein the pair of first pad parts have a height different from that of the pair of a second pad parts.

14. The method of fabricating a semiconductor package of claim 13, wherein the bonding tool further includes a protrusion part protruding from the bonding tool and disposed to at least partially surround the first region.

15. The method of fabricating a semiconductor package of claim 13, wherein the bonding tool further includes a protrusion part formed in the second region and protruding from the bonding tool, and wherein the pad part is formed within the recess such that a top surface of the pad part is level with a top surface of the substrate.

16. The method of fabricating a semiconductor package of claim 15, wherein the bonding tool extends in each of the first direction and the second direction crossing the first direction, wherein the protrusion part includes a pair of first protrusion parts facing each other in the first direction and a pair of second protrusion parts facing each other in the second direction, and wherein the pair of first protrusion parts have the same height as each other, and the pair of second protrusion parts have the same height as each other.

17. The method of fabricating a semiconductor package of claim 16, wherein with respect to the first direction, the pair of first protrusion parts are spaced apart from an outer peripheral surface of the bonding tool.

* * * * *